(12) United States Patent
Takakura et al.

(10) Patent No.: US 12,538,431 B2
(45) Date of Patent: Jan. 27, 2026

(54) PRODUCING METHOD OF WIRED CIRCUIT BOARD

(71) Applicant: NITTO DENKO CORPORATION, Osaka (JP)

(72) Inventors: Hayato Takakura, Osaka (JP); Yasunari Oyabu, Osaka (JP); Naoki Shibata, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 662 days.

(21) Appl. No.: 17/900,406

(22) Filed: Aug. 31, 2022

(65) Prior Publication Data

US 2023/0073563 A1 Mar. 9, 2023

(30) Foreign Application Priority Data

Sep. 7, 2021 (JP) .................................. 2021-145774

(51) Int. Cl.
*H05K 3/00* (2006.01)
*H05K 3/18* (2006.01)

(52) U.S. Cl.
CPC ......... *H05K 3/0061* (2013.01); *H05K 3/0041* (2013.01); *H05K 3/181* (2013.01);
(Continued)

(58) Field of Classification Search
CPC .................. H05K 3/0061; H05K 3/181; H05K 2203/072; H05K 2203/095; H05K 2203/1461; H05K 2203/1545; H05K 3/381; H05K 3/202; H05K 1/09; H05K 2201/0355; H05K 1/0218; Y10T 29/49155; G11B 5/4833
See application file for complete search history.

(56) References Cited

U.S. PATENT DOCUMENTS 5,310,966 A 5/1994 Iida et al.
5,407,557 A 4/1995 Iida et al.
(Continued)

FOREIGN PATENT DOCUMENTS

JP 02-058899 A 2/1990
JP 05-226833 A 9/1993
(Continued)

OTHER PUBLICATIONS

Office Action, issued by the Japanese Patent Office on May 7, 2025, in connection with Japanese Patent Application No. 2021-145774.

*Primary Examiner* — Donghai D Nguyen
(74) *Attorney, Agent, or Firm* — Edwards Neils LLC; Jean C. Edwards, Esq.

(57) ABSTRACT

Provided is a method for producing a wired circuit board in which a first preparation step of preparing a first substrate having an insulating layer and a conductive layer disposed on one surface of the insulating layer; a second preparation step of preparing a second substrate having a metal layer; a bonding step of laminating the first substrate and the second substrate so that the conductive layer and the metal layer are in contact with each other, and metal-bonding the conductive layer and the metal layer; and a patterning step of forming a conductive pattern on the other surface of the insulating layer are carried out.

16 Claims, 6 Drawing Sheets

(52) U.S. Cl.
CPC . *H05K 2203/072* (2013.01); *H05K 2203/095* (2013.01); *H05K 2203/1461* (2013.01)

(56) References Cited

U.S. PATENT DOCUMENTS

| | | | | |
|---|---|---|---|---|
| 5,796,552 | A * | 8/1998 | Akin, Jr. | G11B 5/4853 |
| 6,882,506 | B2 * | 4/2005 | Yamaoka | G11B 5/4833 |
| | | | | 360/245.9 |
| 9,756,735 | B2 * | 9/2017 | Ishihara | H05K 3/4682 |
| 2004/0252413 | A1 | 12/2004 | Nishiyama | |
| 2006/0199402 | A1 | 9/2006 | Ishii et al. | |
| 2007/0128417 | A1 | 6/2007 | Ishii et al. | |
| 2011/0290380 | A1 * | 12/2011 | Okayama | B32B 15/01 |
| | | | | 216/34 |

FOREIGN PATENT DOCUMENTS

| | | | |
|---|---|---|---|
| JP | 2005-011387 | A | 1/2005 |
| JP | 2006-245220 | A | 9/2006 |
| JP | 2007-157836 | A | 6/2007 |
| JP | 2020-145335 | A | 9/2020 |

* cited by examiner

PRODUCING METHOD OF WIRED CIRCUIT BOARD

CROSS REFERENCE TO RELATED APPLICATION

The present application claims priority to Japanese Patent Application No. 2021-145774, filed on Sep. 7, 2021, the contents of which are herein incorporated by reference into this application.

TECHNICAL FIELD

The present invention relates to a method for producing a wired circuit board.

BACKGROUND ART

Conventionally, a method for producing a wired circuit board has been disclosed in which a thin metal film is formed on a metal support board by sputtering or by electrolytic plating; a metal foil is formed on the thin metal film by electrolytic plating; and a base insulating layer, a conductive pattern, and a cover insulating layer are sequentially formed on the metal foil and the metal support board (ref. for example, Patent Document 1 below).

In the method for producing a wired circuit board, the thin metal film is formed between the metal foil and the metal support board in order to improve adhesion strength between the metal foil and the metal support board.

CITATION LIST

Patent Document

Patent Document 1: Japanese Unexamined Patent Publication No. 2006-245220

SUMMARY OF THE INVENTION

Problem to be Solved by the Invention

In the method for producing a wired circuit board as described in Patent Document 1, electrical resistance is caused at an interface between the metal foil and the thin metal film, and an interface between the thin metal film and the metal support board, which makes it difficult to reduce electrical resistance between the metal foil and the metal support board.

There is a case where electrical resistance between the metal foil and the metal support board is desired to be reduced, for example, a case such as where a portion of the conductive pattern is desired to be grounded via the metal foil.

The present invention provides, in a wired circuit board having a conductive layer and a metal layer on the opposite side of a conductive pattern with respect to an insulating layer, a method for producing the wired circuit board capable of reducing electrical resistance between the conductive layer and the metal layer.

Means for Solving the Problem

The present invention [1] includes a method for producing a wired circuit board, including a first preparation step of preparing a first substrate having an insulating layer and a conductive layer disposed on one surface of the insulating layer; a second preparation step of preparing a second substrate having a metal layer; a bonding step of laminating the first substrate and the second substrate so that the conductive layer and the metal layer are in contact with each other, and metal-bonding the conductive layer and the metal layer; and a patterning step of forming a conductive pattern on the other surface of the insulating layer, in which the patterning step is carried out after the bonding step, or the bonding step is carried out after the patterning step.

According to this method, the wired circuit board in which the conductive layer and the metal layer are metal-bonded can be obtained.

Therefore, electrical resistance between the conductive layer and the metal layer can be reduced.

The present invention [2] includes the method for producing a wired circuit board described in [1], in which in the bonding step, the conductive layer and the metal layer are bonded by interface bonding.

According to this method, electrical resistance between the conductive layer and the metal layer can be further reduced.

The present invention [3] includes the method for producing a wired circuit board described in [2], in which in the bonding step, the conductive layer and the metal layer are bonded by solid phase bonding.

According to this method, electrical resistance between the conductive layer and the metal layer can be even further reduced.

The present invention [4] includes the method for producing a wired circuit board described in [3], in which in the bonding step, a first step of activating a surface of the conductive layer and a surface of the metal layer and a second step of bonding the activated surface of the conductive layer and the activated surface of the metal layer are carried out in vacuum.

According to this method, by carrying out the first step and the second step in vacuum, the surface of the conductive layer and the surface of the metal layer are activated while suppressing oxidation and gas molecule adsorption, so that these surfaces can be bonded.

Therefore, electrical resistance at the interface between the conductive layer and the metal layer can be further reduced.

The present invention [5] includes the method for producing a wired circuit board described in any one of the above-described [1] to [4], in which in the first preparation step, a first roll that is a roll of the first substrate is prepared; in the second preparation step, a second roll that is a roll of the second substrate is prepared; and in the bonding step, the first substrate delivered from the first roll and the second substrate delivered from the second roll are laminated.

According to this method, such a roll-to-roll system allows the conductive layer and the metal layer to be bonded, so that production efficiency can be improved.

The present invention [6] includes the method for producing a wired circuit board described in [5], in which the patterning step is carried out after the bonding step.

According to this method, as compared with the case of carrying out the bonding step after the patterning step, the conductive layer and the metal layer can be reliably bonded without requiring the consideration of deformation or the like in the conductive pattern in the bonding step.

The present invention [7] includes the method for producing a wired circuit board described in any one of the above-described [1] to [6], in which the conductive layer is made of copper, and the metal layer is made of copper alloy.

According to this method, electrical resistance between the conductive layer made of copper and the metal layer made of copper alloy can be reduced.

The present invention [8] includes the method for producing a wired circuit board described in any one of the above-described [1] to [7], in which the conductive pattern includes a ground pattern electrically connected to the conductive layer; and a wiring pattern insulated from the conductive layer.

According to this method, electrical resistance between the conductive layer to which the ground pattern is connected and the metal layer can be reduced.

Effects of the Invention

According to the method for producing a wired circuit board of the present invention, electrical resistance between a conductive layer and a metal layer can be reduced.

BRIEF DESCRIPTION OF THE DRAWINGS

FIGS. 3A to 3F graphically illustrate a first embodiment of a method for producing a wired circuit board.

FIGS. 5A to 5F graphically illustrate a second embodiment of the method for producing a wired circuit board.

FIGS. 6A to 6D graphically illustrate a third embodiment of the method for producing a wired circuit board.

DESCRIPTION OF THE EMBODIMENTS

1. Wired Circuit Board

Figure 1:
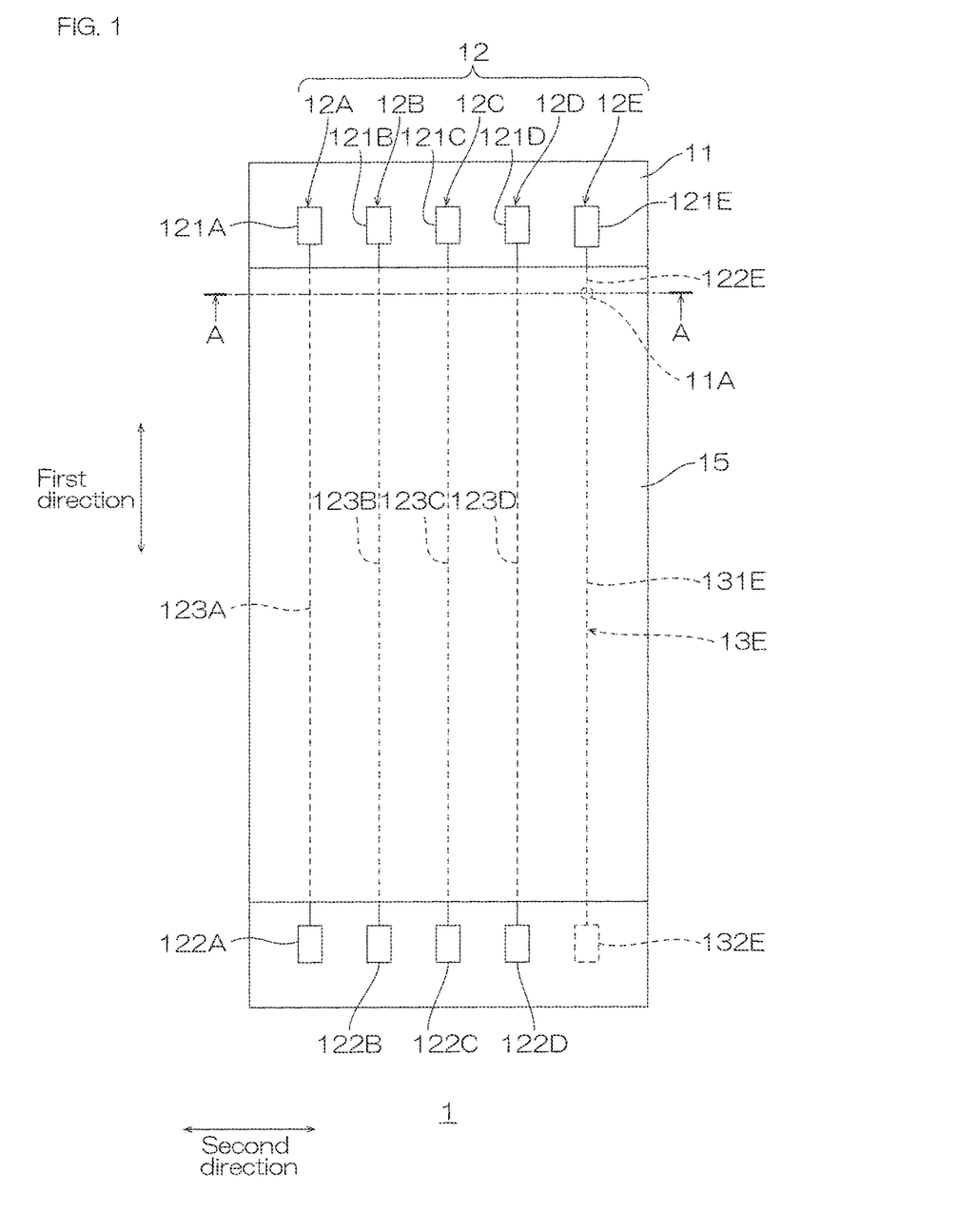
FIG. 1 is a plan view showing an example of a wired circuit board.

As shown in FIG. 1, a wired circuit board 1 extends in a first direction and a second direction. In the present embodiment, the wired circuit board 1 has a generally rectangular shape. The shape of the wired circuit board 1 is not limited.

Figure 2:
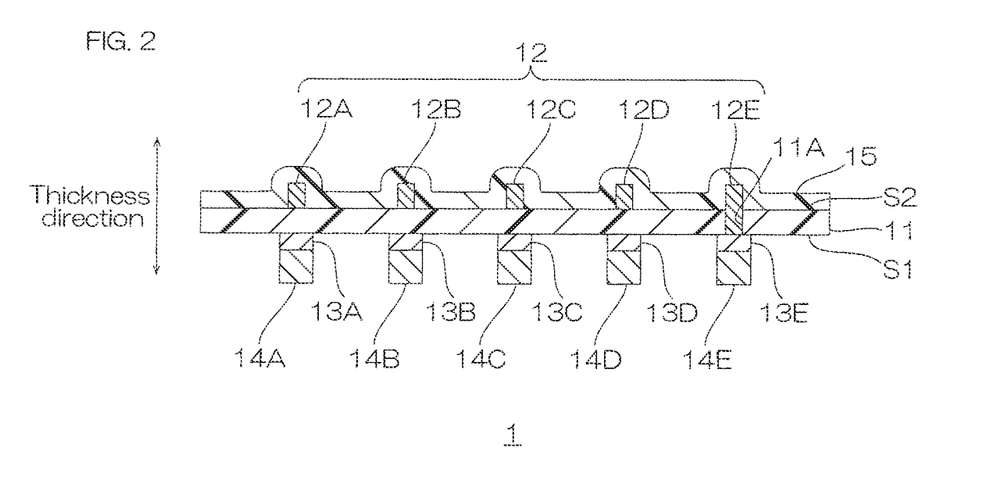
FIG. 2 is a cross sectional view taken along line A-A in FIG. 1.

As shown in FIG. 2, the wired circuit board 1 has a base insulating layer 11, a conductive pattern 12, a plurality of conductive layers 13A, 13B, 13C, 13D, and 13E, a plurality of metal layers 14A, 14B, 14C, 14D, and 14E, and a cover insulating layer 15.

(1) Base Insulating Layer

The base insulating layer 11 is disposed between the conductive pattern 12 and the conductive layers 13A, 13B, 13C, 13D, and 13E in a thickness direction. The thickness direction is orthogonal to each of the first direction and the second direction. The base insulating layer 11 insulates wiring patterns 12A, 12B, 12C, and 12D from the conductive layers 13A, 13B, 13C, and 13D. The wiring patterns 12A, 12B, 12C, and 12D will be described later. The base insulating layer 11 is made of resin. Examples of the resin include polyimide, maleimide, epoxy resin, polybenzoxazole, and polyester. The base insulating layer 11 has one surface S1 and the other surface S2 in the thickness direction.

(2) Conductive Pattern

The conductive pattern 12 is disposed on the other surface S2 of the base insulating layer 11 in the thickness direction. The conductive pattern 12 is made of metal. Examples of the metal include copper, silver, gold, iron, aluminum, chromium, and alloys thereof. From the viewpoint of obtaining good electrical properties, copper is preferably used. The shape of the conductive pattern 12 is not limited.

As shown in FIG. 1, the conductive pattern 12 has the plurality of wiring patterns 12A, 12B, 12C, and 12D, and a ground pattern 12E.

(2-1) Wiring Pattern

The wiring pattern 12A has a terminal 121A, a terminal 122A, and a wire 123A. The wiring pattern 12A electrically connects an electronic component connected to the terminal 121A to an electronic component connected to the terminal 122A.

The terminal 121A is disposed at one end portion of the wired circuit board 1 in the first direction. The terminal 121A has a square land shape.

The terminal 122A is disposed at the other end portion of the wired circuit board 1 in the first direction. The terminal 122A has a square land shape.

One end of the wire 123A is connected to the terminal 121A. The other end of the wire 123A is connected to the terminal 122A. The wire 123A electrically connects the terminal 121A to the terminal 122A.

Each of the wiring patterns 12B, 12C, and 12D can be described in the same manner as the wiring pattern 12A. Therefore, descriptions of each of the wiring patterns 12B, 12C, and 12D are omitted.

(2-2) Ground Pattern

The ground pattern 12E has a ground terminal 121E and a ground wire 122E. The ground pattern 12E connects an electronic component connected to the ground terminal 121E to a ground with the conductive layer 13E interposed therebetween.

The ground terminal 121E is disposed at one end portion of the wired circuit board 1 in the first direction. The ground terminal 121E has a square land shape. The terminals 121A, 121B, 121C, and 121D and the ground terminal 121E are spaced apart from each other and are aligned in the second direction.

One end of the ground wire 122E is connected to the ground terminal 121E. The other end of the ground wire 122E is connected to the conductive layer 13E through a via hole 11A (ref: FIG. 2) in the base insulating layer 11.

(3) Conductive Layer

As shown in FIG. 2, the conductive layers 13A, 13B, 13C, 13D, and 13E are disposed on one surface S1 of the base insulating layer 11 in the thickness direction. The conductive layers 13A, 13B, 13C, 13D, and 13E are made of metal. Examples of the metal include copper, silver, gold, iron, aluminum, chromium, and alloys thereof. From the viewpoint of obtaining good electrical properties, copper is preferably used. The conductive layers 13A, 13B, 13C, 13D, and 13E are spaced apart from each other and are aligned in the second direction, corresponding to the wiring patterns 12A, 12B, 12C, and 12D and the ground pattern 12E.

Specifically, the conductive layer 13A is disposed on the opposite side of the wiring pattern 12A with respect to the base insulating layer 11 in the thickness direction. The conductive layer 13A extends along the wiring pattern 12A. The conductive layer 13A reduces transmission loss in the wiring pattern 12A.

The conductive layer 13B is disposed on the opposite side of the wiring pattern 12B with respect to the base insulating layer 11 in the thickness direction. The conductive layer 13B extends along the wiring pattern 12B. The conductive layer 13B reduces transmission loss in the wiring pattern 12B.

The conductive layer 13C is disposed on the opposite side of the wiring pattern 12C with respect to the base insulating layer 11 in the thickness direction. The conductive layer 13C extends along the wiring pattern 12C. The conductive layer 13C reduces transmission loss in the wiring pattern 12C.

The conductive layer 13D is disposed on the opposite side of the wiring pattern 12D with respect to the base insulating layer 11 in the thickness direction. The conductive layer 13D extends along the wiring pattern 12D. The conductive layer 13D reduces transmission loss in the wiring pattern 12D.

The conductive layer 13E is electrically connected to the ground pattern 12E. As shown in FIG. 1, the conductive layer 13E has a wire portion 131E and a terminal portion 132E. One end of the wire portion 131E is connected to the ground wire 122E. The other end of the wire portion 131E is connected to the terminal portion 132E. The terminal portion 132E is disposed at one end portion of the wired circuit board 1 in the first direction. The terminal portion 132E has a square land shape.

(4) Metal Layer

As shown in FIG. 2, the metal layers 14A, 14B, 14C, 14D, and 14E are spaced apart from each other and are aligned in the second direction, corresponding to the conductive layers 13A, 13B, 13C, 13D, and 13E. The metal layers 14A, 14B, 14C, 14D, and 14E are made of metal. Examples of the metal include stainless steel and copper alloy.

Specifically, the metal layer 14A is disposed on the opposite side of the wiring pattern 12A with respect to the conductive layer 13A in the thickness direction. The metal layer 14A is bonded to the conductive layer 13A. The metal layer 14A supports the conductive layer 13A and the wiring pattern 12A.

The metal layer 14B is disposed on the opposite side of the wiring pattern 12B with respect to the conductive layer 13B in the thickness direction. The metal layer 14B is bonded to the conductive layer 13B. The metal layer 14B supports the conductive layer 13B and the wiring pattern 12B.

The metal layer 14C is disposed on the opposite side of the wiring pattern 12C with respect to the conductive layer 13C in the thickness direction. The metal layer 14C is bonded to the conductive layer 13C. The metal layer 14C supports the conductive layer 13C and the wiring pattern 12C.

The metal layer 14D is disposed on the opposite side of the wiring pattern 12D with respect to the conductive layer 13D in the thickness direction. The metal layer 14D is bonded to the conductive layer 13D. The metal layer 14D supports the conductive layer 13D and the wiring pattern 12D.

The metal layer 14E is disposed on the opposite side of the ground pattern 12E with respect to the conductive layer 13E in the thickness direction. The metal layer 14E is bonded to the conductive layer 13E. The metal layer 14E supports the conductive layer 13E and the ground pattern 12E.

(5) Cover Insulating Layer

As shown in FIG. 1, the cover insulating layer 15 covers wires 123A, 123B, 123C, and 123D, and the ground wire 122E. The cover insulating layer 15 is disposed on the other surface S2 of the base insulating layer 11 in the thickness direction. The cover insulating layer 15 does not cover the terminals 121A, 121B, 121C, and 121D, terminals 122A, 122B, 122C, and 122D, and the ground terminal 121E. The cover insulating layer 15 is made of resin. Examples of the resin include polyimide, maleimide, epoxy resin, polybenzoxazole, and polyester.

2. Method for Producing Wired Circuit Board

Next, a first embodiment of a method for producing the wired circuit board 1 will be described.

Figure 3A:
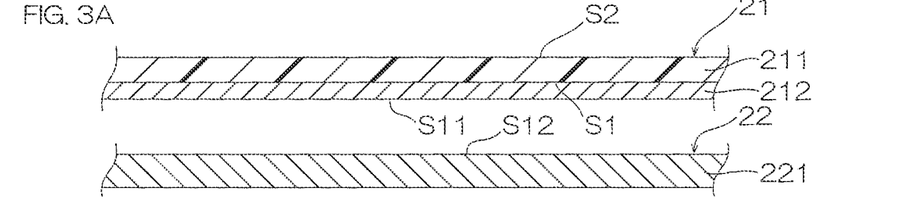
FIG. 3A illustrates a step of preparing a first substrate and a second substrate (first preparation step and second preparation step)
Figure 3B:
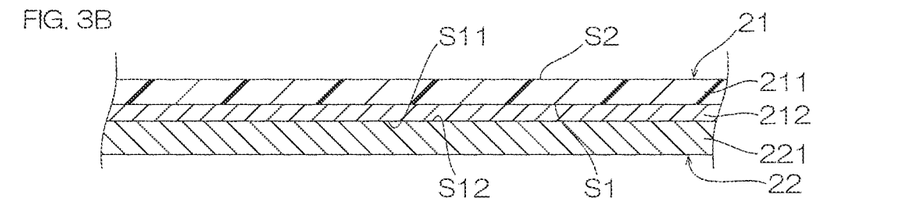
FIG. 3B illustrates a step of bonding between a conductive layer of the first substrate and a metal layer of the second substrate (bonding step)
Figure 3C:
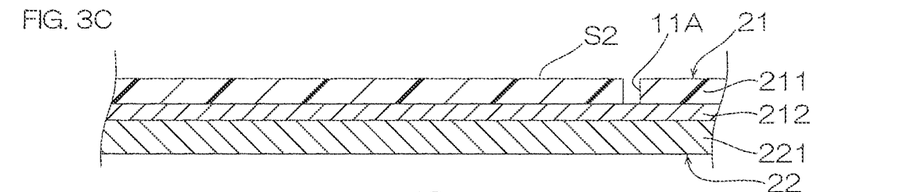
FIG. 3C illustrates a step of forming a via hole in the insulating layer.
Figure 3D:
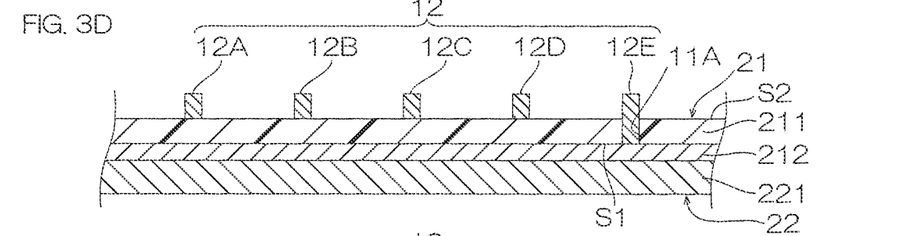
FIG. 3D illustrates a step of forming a conductive pattern (patterning step)
Figure 3E:
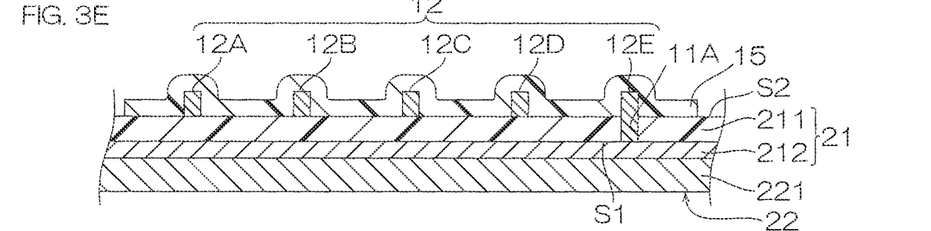
FIG. 3E illustrates a step of forming a cover insulating layer.
Figure 3F:
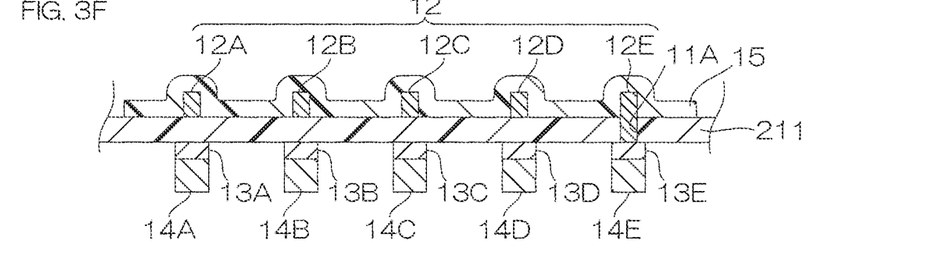
FIG. 3F illustrates a step of etching the metal layer and the conductive layer (etching step).

As shown in FIGS. 3A to 3F, the method for producing the wired circuit board 1 includes a first preparation step (ref: FIG. 3A), a second preparation step (ref: FIG. 3A), a bonding step (ref: FIG. 3B), a patterning step (ref: FIG. 3D), an etching step (ref: FIG. 3F), and an outline processing step.

(1) First Preparation Step

Figure 4:
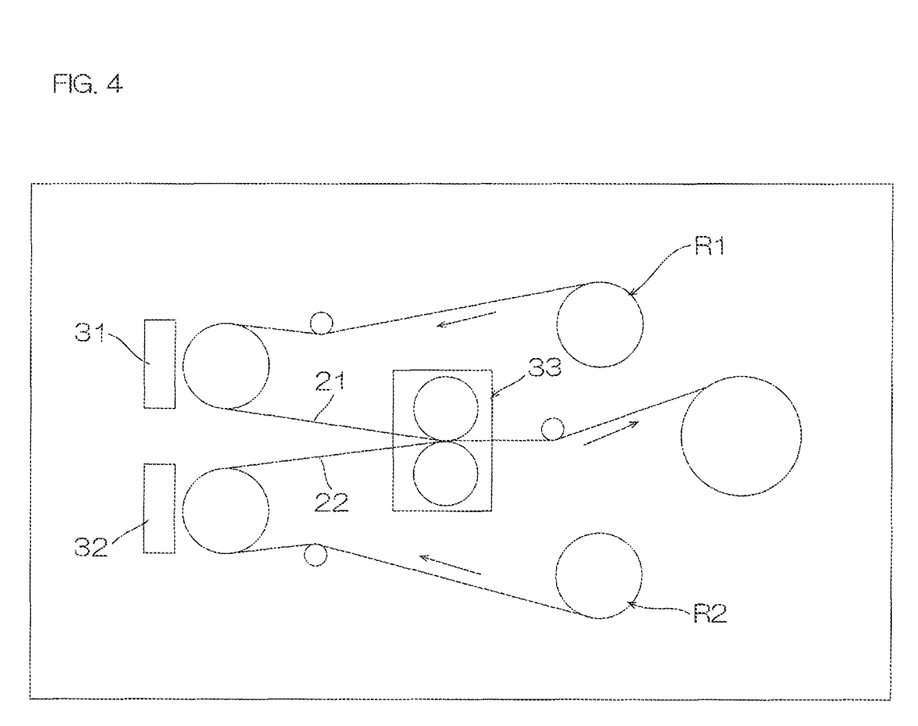
FIG. 4 graphically illustrates details of the bonding step.

As shown in FIG. 3A, in the first preparation step, a first substrate 21 is prepared. In the present embodiment, a first roll R1 (ref: FIG. 4) which is a roll of the first substrate 21 is prepared in the first preparation step. The first substrate 21 has an insulating layer 211 and a conductive layer 212.

The insulating layer 211 is a material for the above-mentioned base insulating layer 11. The insulating layer 211 is made of resin. Examples of the resin include polyimide, maleimide, epoxy resin, polybenzoxazole, and polyester. The insulating layer 211 has one surface S1 and the other surface S2 in the thickness direction.

The insulating layer 212 is a material for the above-mentioned conductive layers 13A, 13B, 13C, 13D, and 13E. The conductive layer 212 is disposed on one surface S1 of the insulating layer 211. The conductive layer 212 is made of metal. Examples of the metal include copper, silver, gold, iron, aluminum, chromium, and alloys thereof. From the viewpoint of obtaining good electrical properties, the conductive layer 212 is preferably made of copper. That is, the first substrate 21 is preferably a copper-clad laminate.

(2) Second Preparation Step

In the second preparation step, a second substrate 22 is prepared. In the present embodiment, a second roll R2 (ref: FIG. 4) which is a roll of the second substrate 22 is prepared in the second preparation step. The second substrate 22 has a metal layer 221. In the present embodiment, the second substrate 22 is made of the metal layer 221 only.

The metal layer 221 is a material for the above-mentioned metal layers 14A, 14B, 14C, 14D, and 14E. The metal 221 is made of metal. Examples of the metal include stainless steel and copper alloy. The metal layer 221 is preferably made of copper alloy.

(3) Bonding Step

Next, as shown in FIG. 3B, in the bonding step, the first substrate 21 and the second substrate 22 are laminated so that the conductive layer 212 and the metal layer 221 are in contact with each other, and the conductive layer 212 and the metal layer 221 are then metal-bonded. In the bonding step, the conductive layer 212 and the metal layer 221 are bonded by preferably, interface bonding, more preferably, solid phase bonding.

In the present embodiment, as shown in FIG. 4, the first substrate 21 delivered from the first roll R1 and the second substrate 22 delivered from the second roll R2 are laminated (roll-to-roll system) in the bonding step. Specifically, in the bonding step, a first step and a second step to be described below are carried out in vacuum.

"Vacuum" herein refers to a state in a space filled with a gas at a pressure lower than normal atmospheric pressure (JIS Z 8126-1: 1999). More specifically, "vacuum" refers to a state in a space filled with a gas at a pressure lower than standard atmospheric pressure. From the viewpoint of suppressing oxidation of the conductive layer 212 and the metal layer 221, and gas molecule adsorption to the conductive layer 212 and the metal layer 221, the higher the degree of vacuum, the more it is preferred.

The first step and the second step are carried out, for example, in high vacuum ($10^{-1}$ to $10^{-5}$ Pa), preferably in ultra-high vacuum ($10^{-5}$ Pa or less).

In the first step, a surface S11 of the conductive layer 212 (ref: FIG. 3A) and a surface S12 of the metal layer 221 (ref: FIG. 3A) are activated.

To activate the surface S11 of the conductive layer 212, the surface S11 of the conductive layer 212 of the first substrate 21 delivered from the first roll R1 is ion-etched by a first ion etching apparatus 31. For example, the surface S11 of the conductive layer 212 of the first substrate 21 delivered from the first roll R1 is irradiated with an argon ion beam by the first ion etching apparatus 31. This eliminates oxides and adsorbates on the surface S11 of the conductive layer 212, and the surface S11 of the conductive layer 212 is activated.

To activate the surface S12 of the metal layer 221, the surface S12 of the metal layer 221 of the second substrate 22 delivered from the second roll R2 is ion-etched by a second ion etching apparatus 32. This eliminates oxides and adsorbates on the surface S12 of the metal layer 221, and the surface S12 of the metal layer 221 is activated.

Next, in the second step, the activated surface S11 of the conductive layer 212 and the activated surface S12 of the metal layer 221 are bonded.

To be specific, the first substrate 21 and the second substrate 22 are brought together so that the activated surface S11 of the conductive layer 212 and the activated surface S12 of the metal layer 221 are in contact with each other, and then pressed by a press apparatus 33.

Then, as shown in FIG. 3B, the surface S11 of the conductive layer 212 and the surface S12 of the metal layer 221 are bonded.

Since oxides and adsorbates are eliminated from the surface S11 of the conductive layer 212 and the surface S12 of the metal layer 221 by carrying out the first step and the second step in vacuum, electrical resistance at the interface between the conductive layer 212 and the metal layer 221 can be further reduced. In addition, adhesion strength between the conductive layer 212 and the metal layer 221 can be further improved.

(4) Patterning Step

Next, in the present embodiment, the patterning step is carried out after the bonding step. This allows reliable bonding between the conductive layer 212 and the metal layer 221 without requiring the consideration of deformation or the like in the conductive pattern 12 in the bonding step, as compared with the case of carrying out the bonding step after the patterning step as in second and third embodiments to be described later. In particular, it is preferable in the case of carrying out the bonding step by the roll-to-roll system.

In the patterning step, the conductive pattern 12 is formed on the other surface S2 of the insulating layer 211.

Specifically, as shown in FIG. 3C, first, a via hole 11A is formed in the insulating layer 211 as required. In the present embodiment, the via hole 11A is formed in order to connect the ground pattern 12E (ref: FIG. 2) to the conductive layer 13E (ref: FIG. 2).

Then, in the present embodiment, as shown in FIG. 3D, the conductive pattern 12 is formed on the other surface S2 of the insulating layer 211 by electroless plating. That is, the conductive pattern 12 is formed by an additive method. The conductive pattern 12 has the ground pattern 12E that is electrically connected to the conductive layer 212, and the wiring patterns 12A, 12B, 12C, and 12D that are insulated from the conductive layer 212. The conductive pattern 12 may be formed by a subtractive method.

Then, as shown in FIG. 3E, the above-mentioned cover insulating layer 15 is formed on the other surface S2 of the insulating layer 211.

(5) Etching Step

Next, as shown in FIG. 3F, the metal layer 221 and the conductive layer 212 are etched to form the conductive layers 13A, 13B, 13C, 13D, and 13E, and the metal layers 14A, 14B, 14C, 14D, and 14E.

(6) Outline Processing Step

Next, as shown in FIG. 2, the insulating layer 211 is outline-processed into a predetermined shape, so that the above-mentioned wired circuit board 1 is obtained. An outline processing method is not limited. Examples of the outline processing method include etching and cutting.

3. Effects (1) According to the method for producing the wired circuit board 1, as shown in FIG. 2, the wired circuit board 1 in which the conductive layers 13A, 13B, 13C, 13D, and 13E are metal-bonded to the metal layers 14A, 14B, 14C, 14D, and 14E, respectively, can be obtained.

Therefore, electrical resistance between the conductive layers 13A, 13B, 13C, 13D, and 13E and the metal layers 14A, 14B, 14C, 14D, and 14E can be reduced.

(2) According to the method for producing the wired circuit board 1, in the bonding step (ref: FIG. 3B), the conductive layer 212 and the metal layer 221 are bonded by interface bonding.

Therefore, electrical resistance between the conductive layers 13A, 13B, 13C, 13D, and 13E and the metal layers 14A, 14B, 14C, 14D, and 14E can be further reduced.

(3) According to the method for producing the wired circuit board 1, in the bonding step (ref: FIG. 3B), the conductive layer 212 and the metal layer 221 are bonded by solid phase bonding.

Therefore, electrical resistance between the conductive layers 13A, 13B, 13C, 13D, and 13E and the metal layers 14A, 14B, 14C, 14D, and 14E can be even further reduced.

(4) According to the method for producing the wired circuit board 1, as shown in FIG. 4, the first step in which the surface S11 of the conductive layer 212 is activated by the first ion etching apparatus 31 and the surface S12 of the metal layer 221 is activated by the second ion etching apparatus 32, and the second step in which the activated surface S11 of the conductive layer 212 and the activated surface S12 of the metal layer 221 are bonded by the press apparatus 33 are carried out in vacuum in the bonding step.

By performing the first step and the second step in vacuum, the surface S11 of the conductive layer 212 and the surface S12 of the metal layer 221 are activated while suppressing oxidation and gas molecule adsorption, so that these surfaces can be bonded.

As a result, electrical resistance at the interface between the conductive layer 212 and the metal layer 221 can be further reduced.

(5) According to the method for producing the wired circuit board 1, as shown in FIG. 4, the first substrate 21 delivered from the first roll R1 and the second substrate 22 delivered from the second roll R2 are laminated in the bonding step.

Therefore, the roll-to-roll system allows the conductive layer 212 and the metal layer 221 to be bonded, so that production efficiency can be improved.

(6) According to the method for producing the wired circuit board 1, as shown in FIG. 3D, the patterning step is carried out after the bonding step (ref: FIG. 3B).

Therefore, as compared with the case of carrying out the bonding step after the patterning step, the conductive layer 212 and the metal layer 221 can be reliably bonded without requiring the consideration of deformation or the like in the conductive pattern 12 in the bonding step.

(7) According to the method for producing the wired circuit board 1, as shown in FIG. 2, when the conductive layer 212 is made of copper and the metal layer 221 is made of copper alloy, electrical resistance between the conductive layers 13A, 13B, 13C, 13D, and 13E made of copper and the metal layers 14A, 14B, 14C, 14D, and 14E made of copper alloy can be reduced.

(8) According to the method for producing the wired circuit board 1, as shown in FIG. 2, electrical resistance between the conductive layer 13E to which the ground pattern 12E is connected and the metal layer 14E can be reduced.

4. Second Embodiment

Next, a second embodiment will be described. In the second embodiment, the same reference numerals are provided for the same members as those in the first embodiment, and the description thereof is omitted.

Figure 5A:
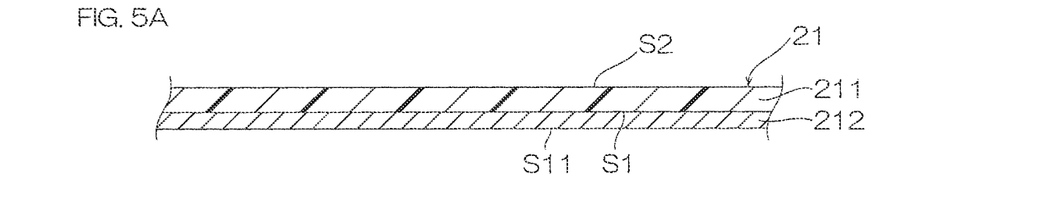
FIG. 5A illustrates a step of preparing a first substrate (first preparation step)
Figure 5B:
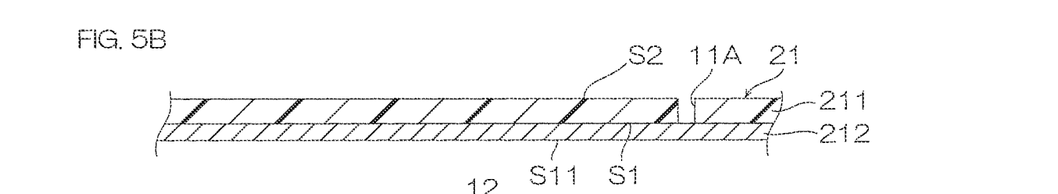
FIG. 5B illustrates a step of forming a via hole in the insulating layer.
Figure 5C:
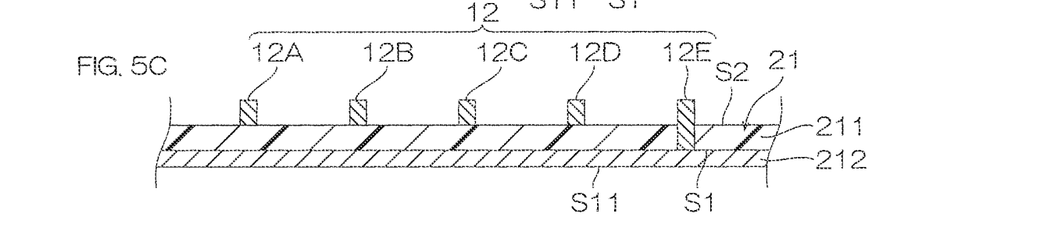
FIG. 5C illustrates a step of forming a conductive pattern (patterning step)
Figure 5D:
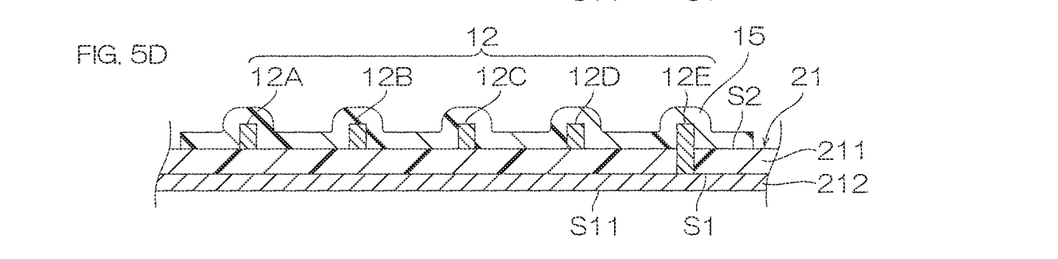
FIG. 5D illustrates a step of forming a cover insulating layer.
Figure 5E:
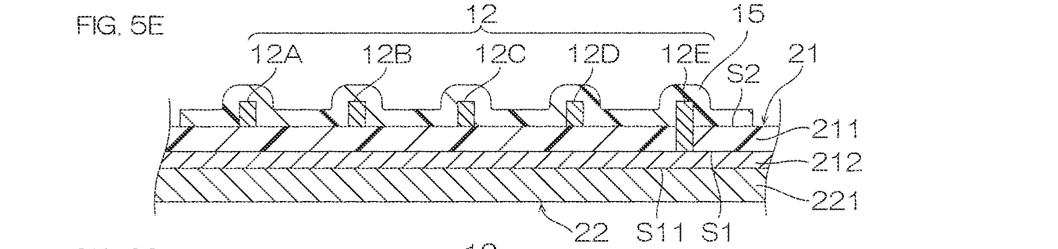
FIG. 5E illustrates a step of preparing a second substrate (second preparation step), and a step of bonding between the conductive layer of the first substrate and the metal layer of the second substrate (bonding step)

As shown in FIGS. 5A to 5F, in the second embodiment, the bonding step (ref: FIG. 5E) is carried out after the patterning step (ref: FIG. 5C).

Specifically, first, as shown in FIG. 5A, the first substrate 21 having the insulating layer 211 and the conductive layer 212 is prepared (first preparation step).

Then, the conductive pattern 12 is formed on the other surface S2 of the insulating layer 211.

Specifically, as shown in FIG. 5B, a via hole 11A is formed in the insulating layer 211 as required.

Then, as shown in FIG. 5C, the conductive pattern 12 is formed on the other surface S2 of the insulating layer 211 by an additive method or a subtractive method (patterning step).

Then, as shown in FIG. 5D, the above-mentioned cover insulating layer 15 is formed on the other surface S2 of the insulating layer 211.

Then, as shown in FIG. 5E, a second substrate 22 having a metal layer 221 is prepared (second preparation step), the first substrate 21 and the second substrate 22 are laminated so that the conductive layer 212 and the metal layer 221 are in contact with each other, and the conductive layer 212 and the metal layer 221 are bonded (bonding step).

Figure 5F:
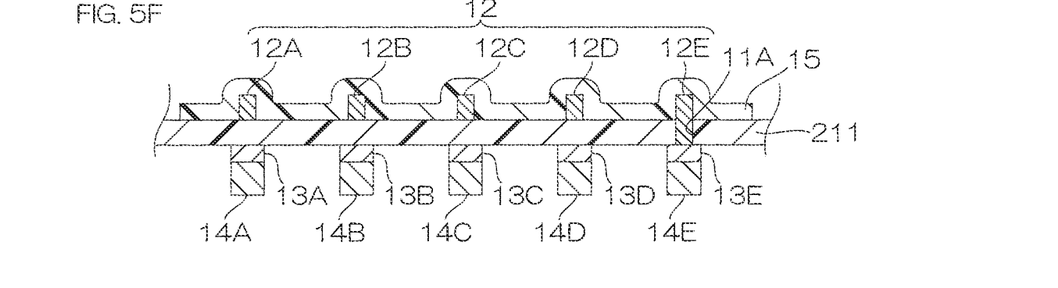
FIG. 5F illustrates a step of etching the metal layer and the conductive layer (etching step).

Then, as shown in FIG. 5F, the metal layer 221 and the conductive layer 212 are etched to form conductive layers 13A, 13B, 13C, 13D, and 13E, and metal layers 14A, 14B, 14C, 14D, and 14E (etching step).

Thereafter, as shown in FIG. 2, the insulating layer 211 is outline-processed into a predetermined shape (outline processing step), so that the above-mentioned wired circuit board 1 is obtained.

The second embodiment can also achieve the same effects as those in the first embodiment.

5. Third Embodiment

Next, a third embodiment will be described. In the third embodiment, the same reference numerals are provided for the same members as those in the second embodiment, and the description thereof is omitted.

Figure 6A:
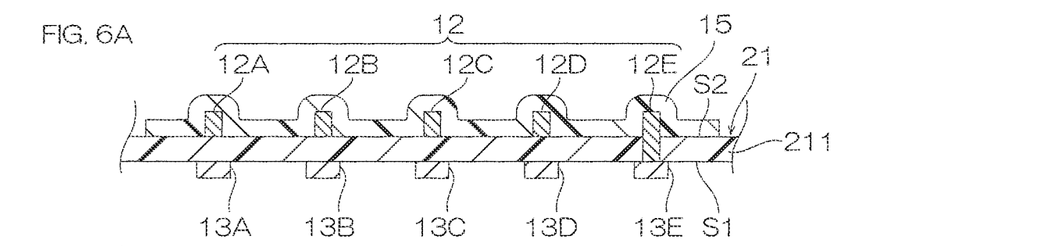
FIG. 6A, subsequent to FIG. 5D, illustrates a step of etching the conductive layer (first etching step)

In the third embodiment, as shown in FIGS. 5A to 5D, steps including the first preparation step (ref: FIG. 5A) and the patterning step (ref: FIG. 5C) are carried out in the same manner as in the second embodiment, and as shown in FIG. 6A, the conductive layer 212 is then etched to form the above-mentioned conductive layers 13A, 13B, 13C, 13D, and 13E (first etching step).

Figure 6B:
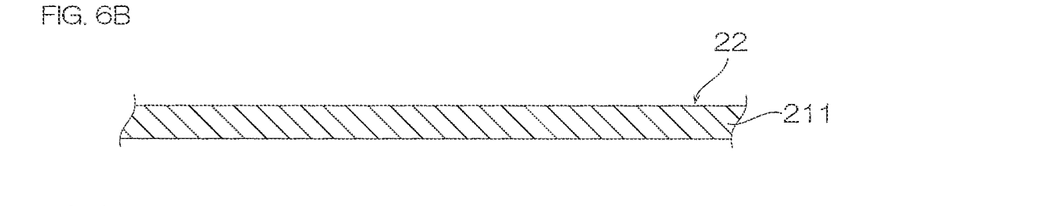
FIG. 6B illustrates a step of preparing a second substrate (second preparation step)
Figure 6C:
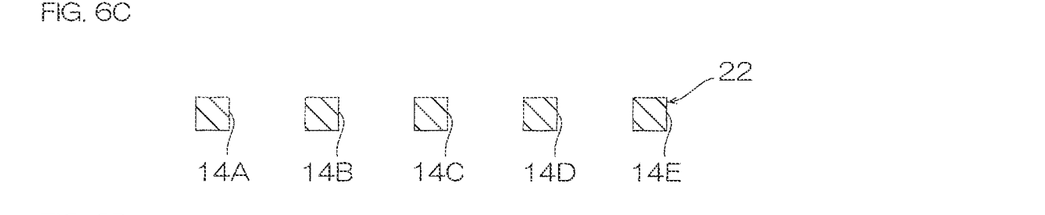
FIG. 6C illustrates a step of etching the metal layer (second etching step)

Then, as shown in FIG. 6B, a second substrate 22 having a metal layer 221 is prepared (second preparation step), as shown in FIG. 6C, the metal layer 221 is etched to form the above-mentioned metal layers 14A, 14B, 14C, 14D, and 14E (second etching step).

Figure 6D:
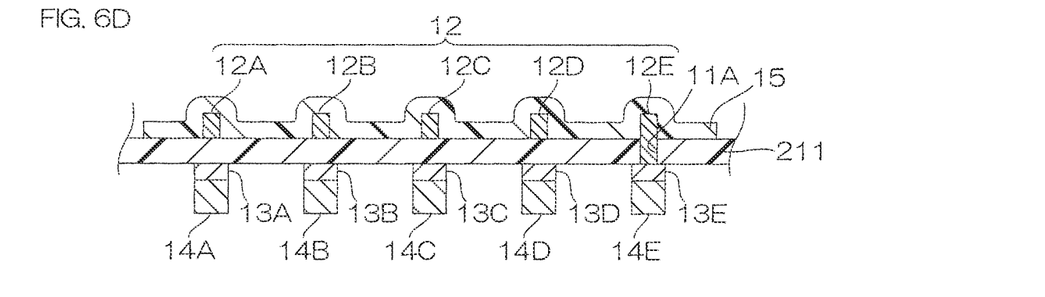
FIG. 6D illustrates a step of bonding between the conductive layer of the first substrate and the metal layer of the second substrate (bonding step).

Thereafter, as shown in FIG. 6D, the first substrate 21 and the second substrate 22 are laminated so that the conductive layers 13A, 13B, 13C, 13D, and 13E and the metal layers 14A, 14B, 14C, 14D, and 14E are in contact with each other, respectively, and the conductive layers 13A, 13B, 13C, 13D, and 13E are bonded to the metal layers 14A, 14B, 14C, 14D, and 14E, respectively (bonding step).

The third embodiment can also achieve the same effects as those in the first embodiment.

6. Modification (1) In the above-mentioned embodiments, the first substrate 21 having the conductive layer 212 only on one surface S1 of the insulating layer 211 is prepared. However, the first substrate 21 may have the conductive layer 212 on each of one surface S1 and the other surface S2 of the insulating layer 211. In this case, in the patterning step, the conductive layer 212 on the other surface S2 is patterned in the conductive pattern 12 by a subtractive method.

(2) In the above-mentioned embodiments, the first substrate 21 and the second substrate 22 are bonded by the roll-to-roll system. However, a sheet of the first substrate 21 and a sheet of the second substrate 22 may be bonded.

While the illustrative embodiments of the present invention are provided in the above-described invention, such is for illustrative purpose only and it is not to be construed restrictively. Modification and variation of the present invention that will be obvious to those skilled in the art is to be covered by the following claims.

INDUSTRIAL APPLICABILITY

The method for producing a wired circuit board according to the present invention is used for production of a wired circuit board.

DESCRIPTION OF REFERENCE NUMERALS 1 wired circuit board
12 conductive pattern
12A wiring pattern
12B wiring pattern
12C wiring pattern
12D wiring pattern
12E ground pattern
21 first substrate
22 second substrate
211 insulating layer
212 conductive layer
221 metal layer
R1 first roll
R2 second roll
S1 one surface of insulating layer
S2 the other surface of insulating layer
S11 surface of conductive layer
S12 surface of metal layer

The invention claimed is:

1. A method for producing a wired circuit board, comprising:
a first preparation step of preparing a first substrate having an insulating layer and a conductive layer disposed on one surface of the insulating layer;
a second preparation step of preparing a second substrate having a metal layer;
a bonding step of laminating the first substrate and the second substrate so that the conductive layer and the metal layer are in contact with each other, and metal-bonding the conductive layer and the metal layer;
a patterning step of forming a conductive pattern on the other surface of the insulating layer; and
an etching step of etching the conductive layer and the metal layer that are bonded in the bonding step,
wherein the patterning step is carried out after the bonding step, or the bonding step is carried out after the patterning step.

2. The method for producing a wired circuit board according to claim 1, wherein, in the bonding step, the conductive layer and the metal layer are bonded by interface bonding.

3. The method for producing a wired circuit board according to claim 2, wherein, in the bonding step, the conductive layer and the metal layer are bonded by solid phase bonding.

4. The method for producing a wired circuit board according to claim 1, wherein,
in the first preparation step, a first roll that is a roll of the first substrate is prepared;
in the second preparation step, a second roll that is a roll of the second substrate is prepared; and
in the bonding step, the first substrate delivered from the first roll and the second substrate delivered from the second roll are laminated.

5. The method for producing a wired circuit board according to claim 4, wherein the patterning step is carried out after the bonding step.

6. The method for producing a wired circuit board according to claim 3, wherein, in the bonding step,
a first step of activating a surface of the conductive layer and a surface of the metal layer, and
a second step of bonding the activated surface of the conductive layer and the activated surface of the metal layer are carried out in vacuum.

7. The method for producing a wired circuit board according to claim 1, wherein
the conductive layer is made of copper, and
the metal layer is made of copper alloy.

8. The method for producing a wired circuit board according to claim 1, wherein the conductive pattern comprises
a ground pattern electrically connected to the conductive layer; and
a wiring pattern insulated from the conductive layer.

9. A method for producing a wired circuit board, comprising:
a first preparation step of preparing a first substrate having an insulating layer and a conductive layer disposed on one surface of the insulating layer;
a first etching step of etching the conductive layer;
a second preparation step of preparing a second substrate having a metal layer;
a second etching step of etching the metal layer;
a bonding step of laminating the first substrate and the second substrate so that the conductive layer and the metal layer are in contact with each other, and metal-bonding the conductive layer and the metal layer after the first etching step and the second etching step; and
a patterning step of forming a conductive pattern on the other surface of the insulating layer,
wherein the patterning step is carried out after the bonding step, or the bonding step is carried out after the patterning step.

10. The method for producing a wired circuit board according to claim 9, wherein, in the bonding step, the conductive layer and the metal layer are bonded by interface bonding.

11. The method for producing a wired circuit board according to claim 10, wherein, in the bonding step, the conductive layer and the metal layer are bonded by solid phase bonding.

12. The method for producing a wired circuit board according to claim 11, wherein, in the bonding step,
a first step of activating a surface of the conductive layer and a surface of the metal layer, and
a second step of bonding the activated surface of the conductive layer and the activated surface of the metal layer are carried out in vacuum.

13. The method for producing a wired circuit board according to claim 9, wherein, in the first preparation step,
a first roll that is a roll of the first substrate is prepared;
in the second preparation step, a second roll that is a roll of the second substrate is prepared; and
in the bonding step, the first substrate delivered from the first roll and the second substrate delivered from the second roll are laminated.

14. The method for producing a wired circuit board according to claim 13, wherein the patterning step is carried out after the bonding step.

15. The method for producing a wired circuit board according to claim 9, wherein the conductive layer is made of copper, and the metal layer is made of copper alloy.

16. The method for producing a wired circuit board according to claim 9, wherein the conductive pattern comprises:

a ground pattern electrically connected to the conductive layer; and a wiring pattern insulated from the conductive layer.

\* \* \* \* \*